United States Patent
Kyomasu et al.

(10) Patent No.: US 6,491,202 B1
(45) Date of Patent: Dec. 10, 2002

(54) WIRE BONDING APPARATUS AND METHOD

(75) Inventors: Ryuichi Kyomasu, Kodaira (JP); Fumio Miyano, Akiruno (JP); Toshihiko Toyama, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/607,259

(22) Filed: Jun. 30, 2000

(30) Foreign Application Priority Data

Jul. 2, 1999 (JP) ............................................ 11-188938

(51) Int. Cl.[7] ................................................ B23K 1/06
(52) U.S. Cl. ........................................ 228/1.1; 228/4.5
(58) Field of Search .......................... 228/1.1, 4.5–6.2, 228/110.1, 227, 230; 156/73.2, 580.1, 580.2; 219/56.21, 56.1; 257/784, 786; 29/872, 873

(56) References Cited

U.S. PATENT DOCUMENTS

| | | | | |
|---|---|---|---|---|
| 4,692,839 A | * | 9/1987 | Lee et al. | |
| 5,201,450 A | * | 4/1993 | Ahn | |
| 5,501,388 A | * | 3/1996 | Takeuchi | |
| 5,923,086 A | * | 7/1999 | Winer et al. | |

FOREIGN PATENT DOCUMENTS

| JP | S59-184537 | 10/1984 |
|---|---|---|
| JP | H4-262545 | 9/1992 |

* cited by examiner

*Primary Examiner*—M. Alexandra Elve
*Assistant Examiner*—Jonathan Johnson
(74) *Attorney, Agent, or Firm*—Koda & Androlia

(57) ABSTRACT

A wire bonding apparatus equipped with a chip heating assembly which is installed above a heater block that contains heaters so as to heat the chip portion of a device such as a semiconductor device, and a cooling pipe which is installed in the heater block so as to cool the heater block. The temperature of the bonding surface of the device is maintained by the chip heating assembly at a temperature that allows bonding to be executed while the heater block is cooled by cooling water or a cooling air draft that flows through the cooling pipe so that the temperature of the heater block is maintained at a low temperature that cause no softening of the resin substrate of the device.

2 Claims, 1 Drawing Sheet

WIRE BONDING APPARATUS AND METHOD

BACKGROUND OF THE INVENTION

1. Field of the Invention

The present invention relates to a wire bonding apparatus and method, and more particularly, to a heating apparatus and method for devices, such as semiconductor devices.

2. Prior Art

Generally, the substrates of semiconductor devices are made of a metal. Recently, from the standpoint of cost reduction, in such devices, numerous chips are mounted in a dense concentration on a resin-made substrate, and wire bonding is performed on these chips; and after which the chips are all molded at the same time, thus forming into individual devices.

In wire bonding, the undersurface of the substrate is heated by a heater block for the purpose of maintaining the surface temperature of the device at a high temperature. This heating is done in order to improve the reliability of bonding. However, resins have the softening temperature of as low as, for instance, approximately 150° C. In addition, resins have high heat insulating properties. Accordingly, it is difficult to heat the surface of the chip, which is to be bonded, to a high temperature using a method that heats the undersurface of the resin-made substrate with a heater block.

A wire bonding apparatus equipped with a heater block for accomplishing the heating as described above is disclosed in, for instance, Japanese Patent Application Laid-Open (Kokai) No. H4-262545.

In view of the above difficulties, it is conceivable to accomplish heating by blowing a hot air draft onto the bonding parts of a chip from above. Japanese Patent Application Laid-Open (Kokai) No. S59-184537 discloses a method in which heating is accomplished by blowing a hot air draft onto the upper surface of the chip.

However, even in the hot air blowing method, there is a possibility that the substrate will soften if heat producing a temperature of 200° C. is applied for a long period of time in order to perform stable bonding. If the substrate softens, the ultrasonic energy and load of a capillary will escape during bonding by being absorbed by the substrate, resulting in that stable bonding cannot be performed. Thus, such softening must be prevented.

SUMMARY OF THE INVENTION

Accordingly, the object of the present invention is to provide a wire bonding apparatus and method which performs wire bonding while maintaining the upper surface of a device at a required temperature and at the same time maintaining the device at a temperature that causes no softening or deformation of the resin substrate of the device.

The above object is accomplished by a unique structure of the present invention for a wire bonding apparatus in which a device that includes a resin substrate is placed on a heater block that has a heater, held by a frame retainer and subjected to wire bonding; and in the present invention, the temperature of the bonding surface of the device is maintained at a temperature that allows bonding, while the heater block is cooled by a cooling means so that the temperature of the heater block is maintained at a low temperature that does not soften the resin substrate.

The above object is accomplished by another unique structure of the present invention for a wire bonding apparatus in which a device that includes a resin substrate is placed on a heater block that has a heater, held by a frame retainer and subjected to wire bonding; and in the present invention, the apparatus is provided with a chip heating means which is disposed above the heater block so as to heat the chip portions of the device, and a heater block cooling means which is installed in the heater block so as to cool the heater block, so that the temperature of the bonding surface of the device is maintained at a temperature that allows bonding, while the heater block is cooled by a cooling means so that the temperature of the heater block is maintained at a low temperature that does not soften the resin substrate.

The above object is further accomplished by a unique wire bonding method of the present that is executed in a wire bonding apparatus in which a device that includes a resin substrate is placed on a heater block that has a heater, held by a frame retainer and subjected to wire bonding; and in the method of present invention, the temperature of the bonding surface of the device is maintained at a temperature that allows bonding, while the heater block is cooled by a cooling means so that the temperature of the heater block is maintained at a low temperature that prevents the resin substrate from softening.

DETAILED DESCRIPTION OF THE PREFERRED EMBODIMENTS

Figure 1:
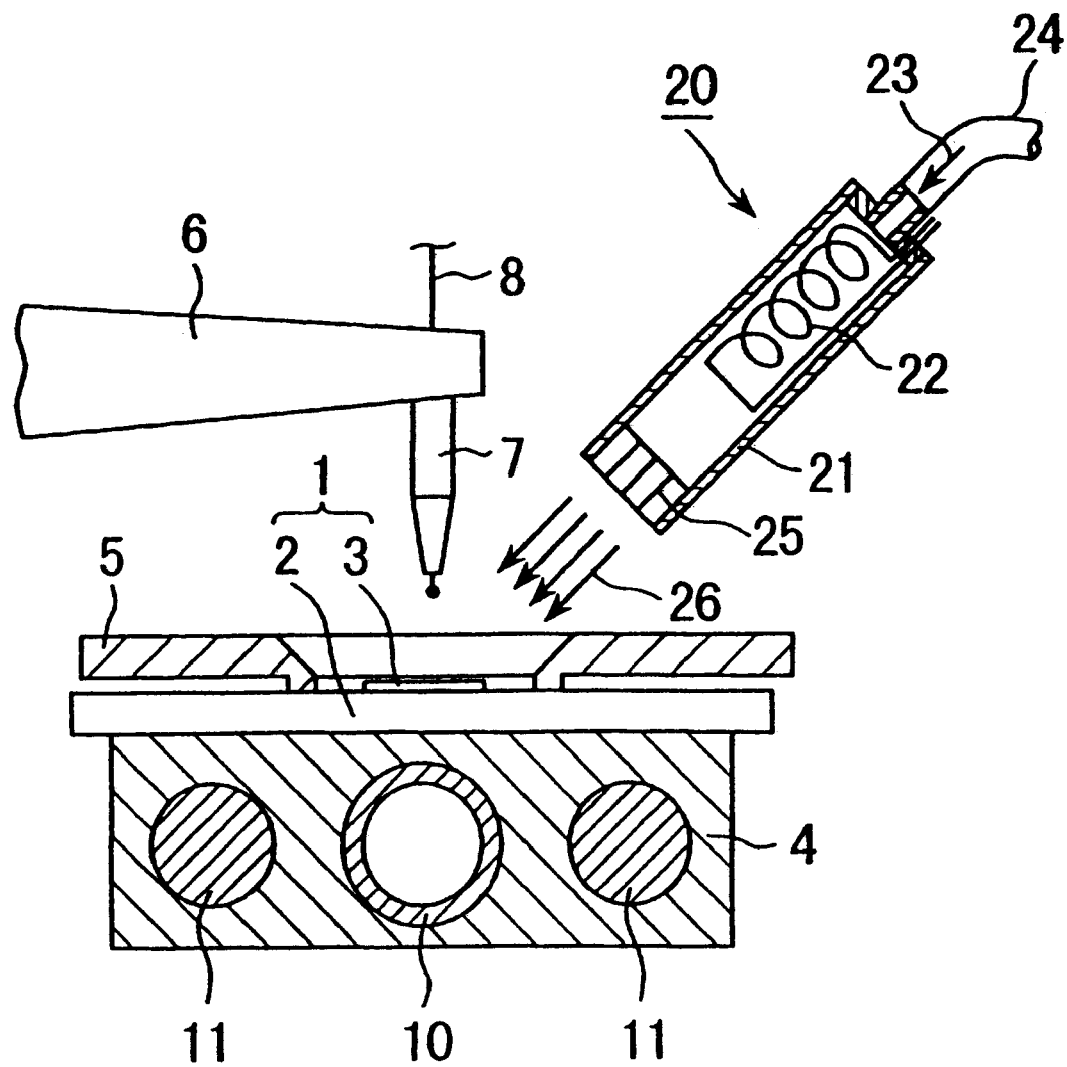
FIG. 1 illustrates one embodiment of the wire bonding apparatus and method of the present invention.

One embodiment of the present invention will be described with reference to FIG. 1.

In device 1, a chip 3 is pasted to the surface of a resin substrate 2. The resin substrate 2 is positioned on a heater block 4 and is held by a frame retainer 5. A wire 8 passing through a capillary 7 that is provided at the tip end of an ultrasonic horn 6 is connected to the pads (not shown) of the chip 3 and the leads (not shown) of the resin substrate 2 by the capillary 7.

The structure described above is well known, and a further description will be omitted.

The heater block 4 is provided at the center thereof with a cooling pipe 10 through which cooling water or a cooling air draft flows. Heaters 11 are installed on both sides of the cooling pipe 10 of the heater block 4.

A chip heating means 20 that heats the chip 3 is installed above the heater block 4. In this chip heating means 20, a thermoelectric wire 22 is installed inside a main heating body 21 thereof, and a pipe 24 that supplies compressed air 23 is connected to one end (the upper end in FIG. 1) of the main heating body 21. A honeycomb-form flow-adjusting plate 25 that causes the hot air draft to flow as a laminar flow is installed in another end (the lower end in FIG. 1) of the main heating body 21.

Next, the operation of this embodiment will be described.

The compressed air 23 supplied through the pipe 24 is heated by the thermoelectric wire 22 so that this compressed air 23 is converted into a hot air draft 26. This hot air draft 26 converted into a laminar flow by the flow-adjusting plate 25 heats the chip 3 and areas around the chip 3, so that the bonding surface of the device 1 is heated to the required temperature. The temperature of the undersurface of the resin substrate 2 of the device 1 is controlled by the heat generated by the heaters 11 and by the cooling water or cooling air draft that flows through the cooling pipe 10 so that the temperature of the resin substrate 2 is maintained at a temperature below the softening point of the resin, e.g., a temperature of 130° C.

As a result, the temperature sufficient for bonding is obtained by the chip heating means 20 at the upper surface of the device 1, and the temperature of the resin substrate 2 can be maintained by the heater block 4 at a temperature below the softening point of the resin substrate 2.

The temperature suitable for preventing the resin substrate 2 from softening is appropriately adjusted based upon the material of the resin substrate 2. Moreover, the temperature at the undersurface of the resin substrate 2 can easily be measured by a thermometer set in the heater block 4. The temperature control of the upper surface of the device 1 can be accomplished by measuring the infrared radiation emitted from the surface of the device. An easy method to accomplish this is to measure the gas generated as a result of the heating of the device 1.

As seen from the above, by controlling the cooling water or cooling air draft that flows through the cooling pipe 10, bonding is performed with the temperature of the bonding surface of the device 1 maintained at a temperature that allows bonding and with the temperature of the resin substrate 2 maintained at a sufficiently low temperature so that no softening of the resin substrate occurs.

According to the present invention, the temperature of the bonding surface of the device is maintained at a temperature that allows bonding to be performed, and the heater block which includes heaters is cooled by a cooling means so that the temperature of the heater block is maintained at a low temperature that does not cause softening of the resin substrate. Therefore, wire bonding is performed with the upper surface of the device maintained at the necessary temperature and with the resin substrate of the device maintained at a temperature that does not cause softening or deformation of the resin substrate.

What is claimed is:

1. A wire bonding apparatus in which a device that includes a resin substrate is placed on a heater block which is provided therein with a frame retainer and subjected to wire bonding, wherein said heater block comprises a heating means provided above said device for maintaining a temperature of a bonding surface of said device at a temperature that allows bonding to be performed, and a cooling means provided within said heater block for cooling said heater block so that a temperature of a surface of said heater block in contact with an undersurface of said resin substrate is controlled to be at a temperature less tan a softening temperature of said resin substrate.

2. A wire boxing apparatus in which a device that includes a resin substrate is placed on a heater block which is provided therein with a heater, held by a frame retainer and subjected to wire bonding, wherein said apparatus comprises:

a chip heating means disposed above said heater block so as to heat a chip portion of said device, and a heater block cooling means installed within said heater block so as to cool said heater block, and wherein a temperature of a bonding surface of said device is maintained at a temperature that allows bonding to be performed by said chip heating means, while said heater block is cooled by said heater block cooling means for controlling a temperature of a surface of said heater block in contact with au undersurface of said resin substrate at a temperature less than a softening temperature of said resin substrate.

* * * * *